United States Patent
Crass et al.

[11] Patent Number: 5,412,312
[45] Date of Patent: May 2, 1995

[54] FREQUENCY AND INSTANTANEOUS VOLTAGE LEVEL METER

[75] Inventors: Matthew M. Crass; Robert D. Braun, both of Kenosha, Wis.

[73] Assignee: Snap-on Incorporated, Kenosha, Wis.

[21] Appl. No.: 955,348

[22] Filed: Oct. 1, 1992

[51] Int. Cl.⁶ .................... G01R 19/00; G01R 29/00
[52] U.S. Cl. ................... 324/122; 324/115; 345/39
[58] Field of Search ............... 324/115, 122, 142, 133, 324/433, 436, 435, 103 R, 103 P, 114; 340/660, 658; 345/39, 40

[56] References Cited

U.S. PATENT DOCUMENTS

| | | | |
|---|---|---|---|
| 1,704,520 | 3/1929 | Sommer | 324/103 R |
| 3,679,965 | 7/1972 | Wilkinson | 323/19 |
| 3,754,121 | 8/1973 | Delay et al. | 324/122 |
| 3,825,827 | 7/1974 | Tumbush | 324/103 P |
| 3,864,631 | 2/1975 | Zitelli et al. | 324/115 |
| 3,911,360 | 10/1975 | Kimzey | 324/133 |
| 4,065,716 | 12/1977 | O'Brien | 324/122 |
| 4,144,524 | 3/1979 | Fleming | 324/122 |
| 4,166,245 | 8/1979 | Roberts | 324/103 P |
| 4,251,769 | 2/1981 | Ewert et al. | 324/122 |
| 4,262,255 | 4/1981 | Kokei et al. | 324/122 |
| 4,296,375 | 10/1981 | Takezaki | 324/122 |
| 4,528,501 | 7/1985 | Dorrouth et al. | 324/122 |
| 4,609,914 | 9/1986 | Fathi | 340/660 |
| 4,635,142 | 1/1987 | Haugland | 324/103 P |
| 4,641,090 | 2/1987 | Danby | 324/115 |
| 4,797,608 | 1/1989 | White | 324/133 |
| 4,812,744 | 3/1989 | Havel | 324/115 |
| 4,920,311 | 4/1990 | Bateman et al. | 324/103 P |
| 5,027,285 | 6/1991 | McCartney et al. | 364/483 |

*Primary Examiner*—Vinh Nguyen
*Attorney, Agent, or Firm*—Emrich & Dithmar

[57] ABSTRACT

A volt/frequency meter includes LED arrays which provide bar-graph style meter displays of the instantaneous voltage and the frequency of a variable electric analog signal. Each LED in the voltage array corresponds to a predetermined voltage range and each LED in the frequency array corresponds to a predetermined frequency range. The meter is switchable among three different voltage scales and three different frequency scales. A separate LED flashes momentarily in response to the input signal crossing a user-determined limit set point which is adjusted through a knob on the front panel. The limit set point controls the operation of the frequency display such that the displayed frequency is the rate at which the analog signal crosses the limit set point.

19 Claims, 6 Drawing Sheets

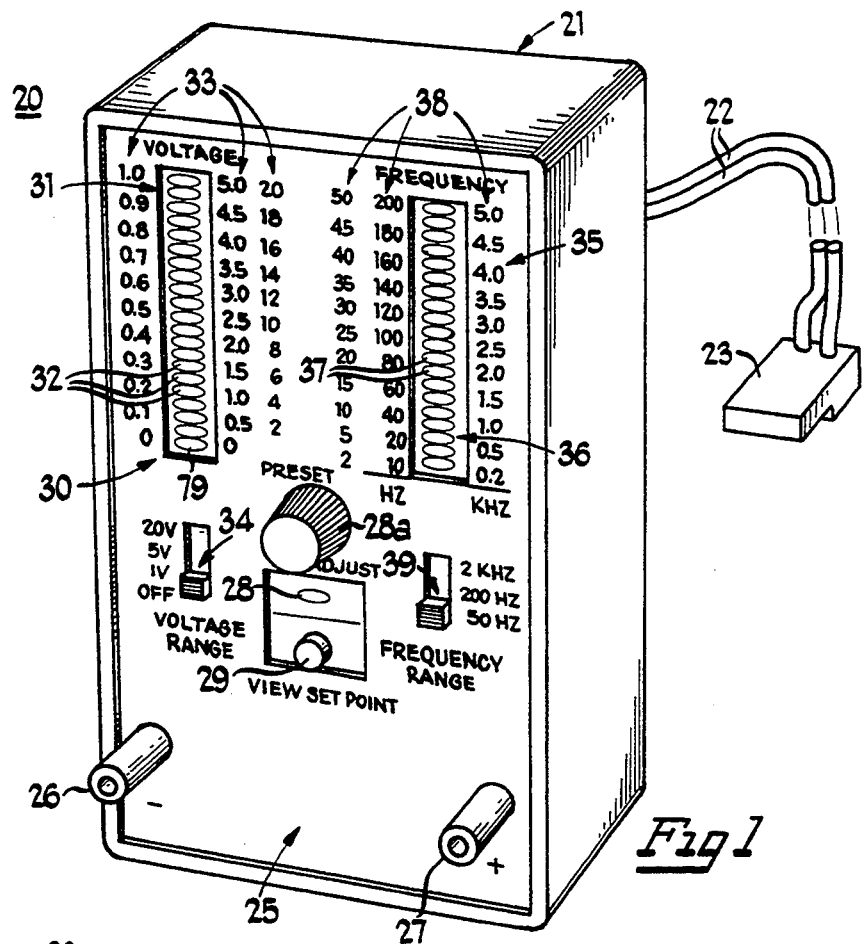
Fig 1
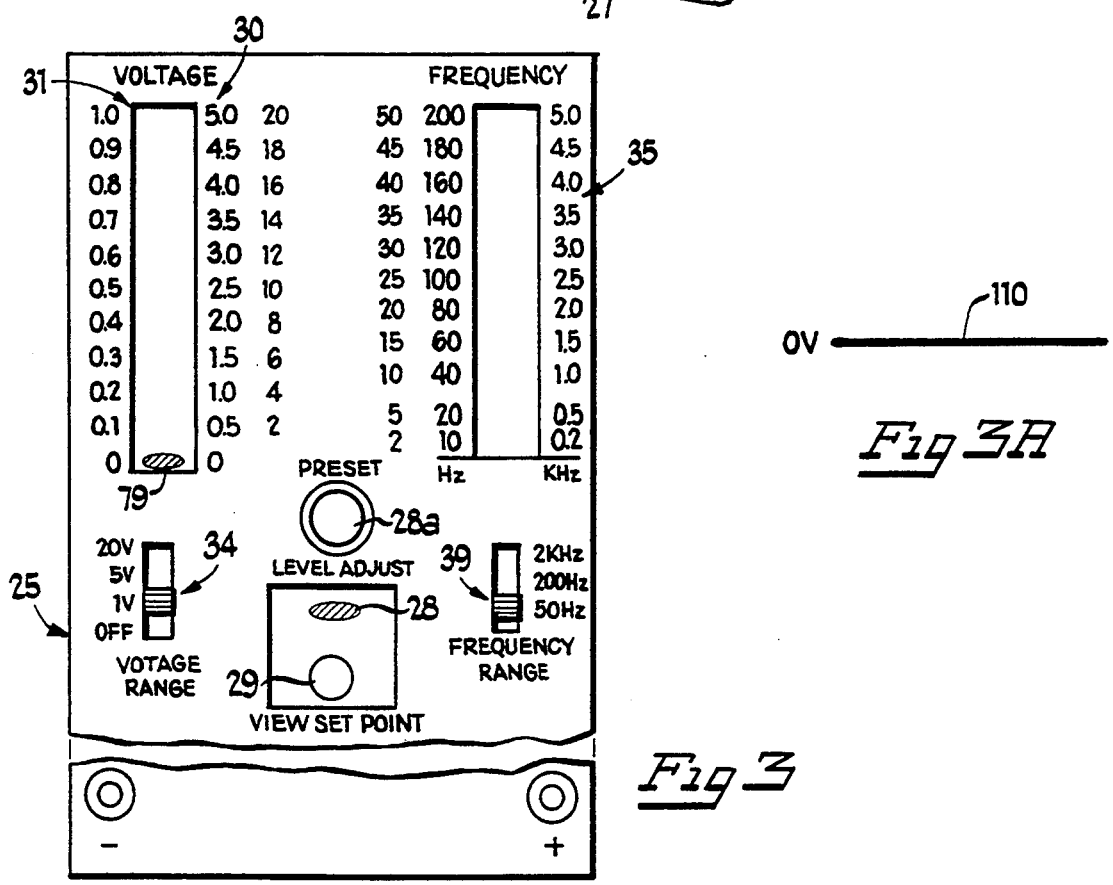
Fig 3
Fig 3A

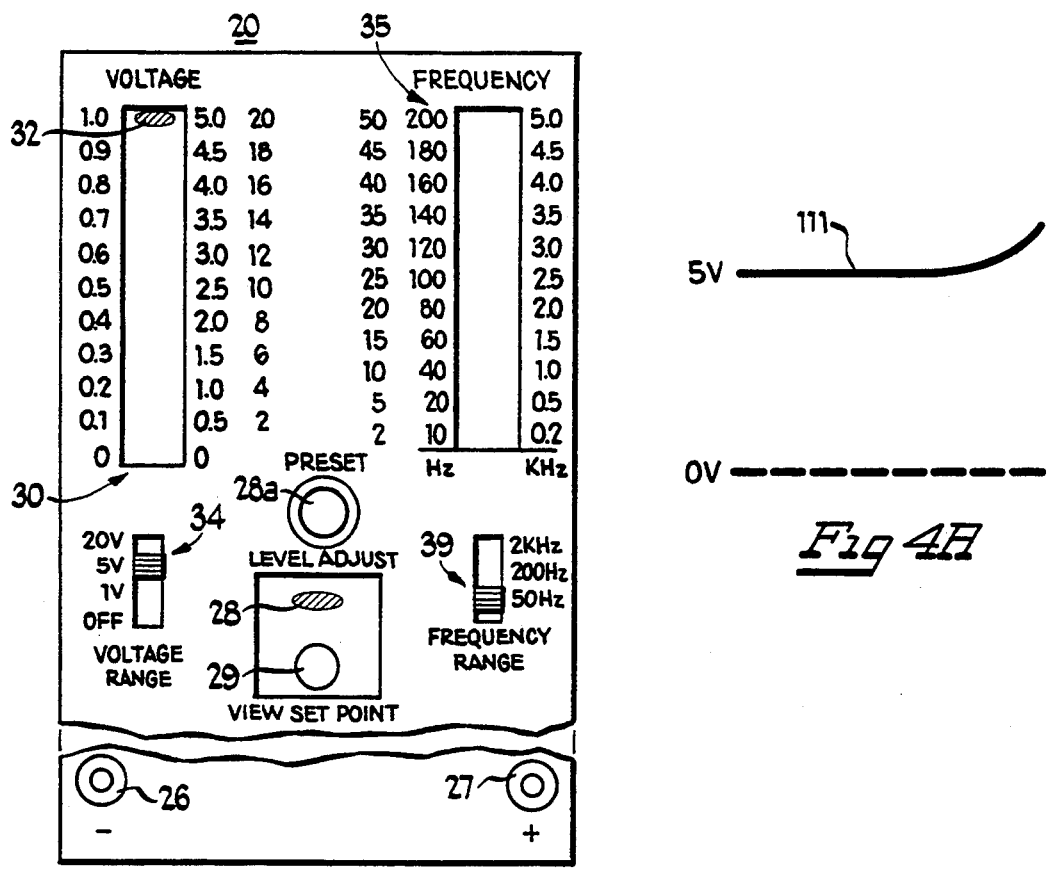
Fig 4
Fig 4A
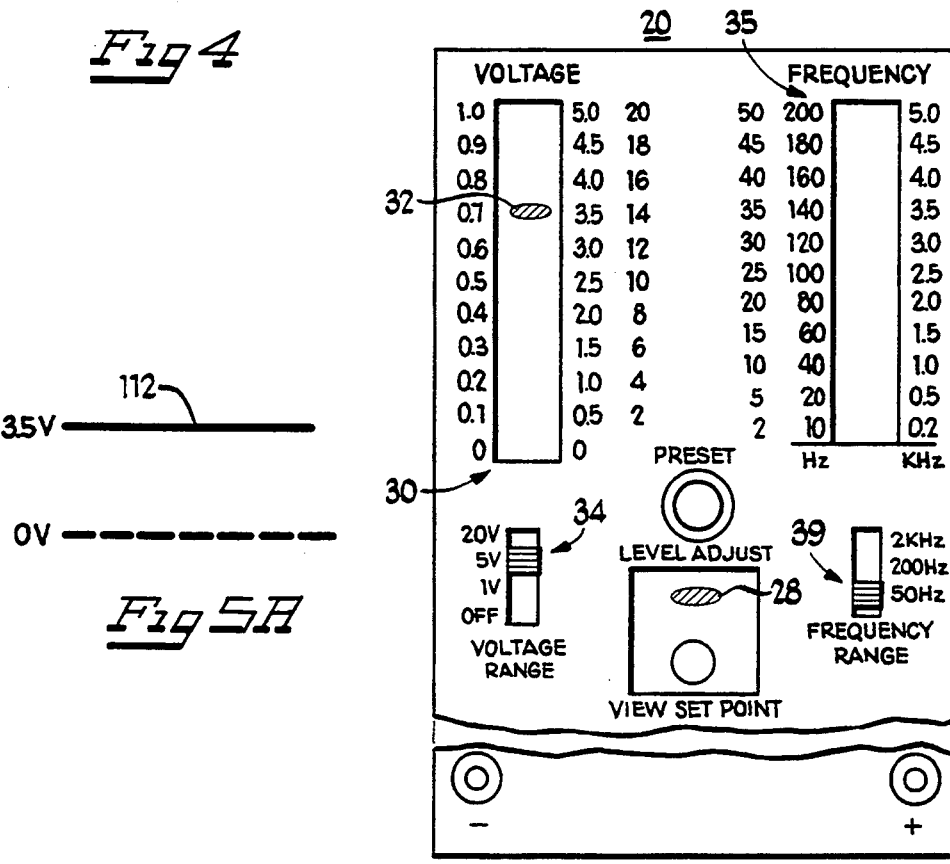
Fig 5A
Fig 5

FREQUENCY AND INSTANTANEOUS VOLTAGE LEVEL METER

BACKGROUND OF THE INVENTION

1. Field of the Invention

The present invention relates to devices for displaying parameter values for variable electrical signals and, in particular, to devices for displaying the voltage and frequency of such signals.

2. Description of the Prior Art

Voltage frequency meters have heretofore been provided which will afford a display of the voltage or the frequency of an input signal, the choice being selectable by the user. But such devices do not permit the simultaneous display of both the voltage and the frequency of the signal.

Most voltage and frequency meters give displays of the peak or average values of the signal. It is known to provide a bar graph-type display which more graphically illustrates the fluctuations in the peak or average values of the signal. But such prior devices have not heretofore displayed instantaneous values and have not displayed both the peaks and the valleys of an alternating signal so that the fluctuations in the signal can more readily be observed. Furthermore, prior meters have not provided an indication of the nature of the waveform of the input signal.

SUMMARY OF THE INVENTION

It is a general object of the invention to provide an improved electrical signal meter which avoids the disadvantages of prior meters while affording additional structural and operating advantages.

An important feature of the invention is the provision of a meter device for a variable electric analog signal which provides a visual display of the instantaneous level of a predetermined signal parameter.

In connection with the foregoing feature, another feature of the invention is the provision of a meter apparatus of the type set forth which affords simultaneous display of the levels of two different signal parameters.

Still another feature of the invention is the provision of a meter apparatus of the type set forth which affords a display of instantaneous parameter values so as to follow the peaks and valleys of an alternating signal.

Still another feature of the invention is the provision of a meter apparatus of the type set forth which provides an indication when the input signal crosses a predetermined set point limit.

In connection with the foregoing feature, another feature of the invention is the provision of an apparatus of the type set forth which affords selection of the set point limit and selective display thereof.

Yet another feature of the invention is the provision of an apparatus of the type set forth which displays the frequency with which the input signal crosses the limit level.

Another feature of the invention is the provision of an apparatus of the type set forth which provides an indication of even a momentary crossing of the limit level.

A further feature of the invention is the provision of an apparatus of the type set forth which provides an indication of the nature of the input signal.

These and other features of the invention are attained by providing an apparatus for providing a visual display of the instantaneous level of a variable electric analog signal comprising: first display means including a series of display elements respectively corresponding to different predetermined signal level ranges, display drive means coupled to the first display means and responsive to the analog signal for activating a display element for as long as the instantaneous level of the analog signal lies in the range corresponding to the display element, limit selection means for selecting a predetermined limit, comparison means for comparing the analog signal to the predetermined limit and generating a limit signal when the instantaneous level of the analog signal passes beyond the predetermined limit, and second display means coupled to the comparison means and responsive to the limit signal for producing a visual indication.

SUMMARY OF THE INVENTION

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a perspective view of a meter constructed in accordance with and embodying the features of the present invention;

FIG. 3 is a fragmentary front elevational view of the front panel of the meter of FIG. 1, illustrating display of a zero level voltage signal;

FIG. 3A is a graphical representation of the voltage signal being displayed in FIG. 3;

FIG. 4 is a view similar to FIG. 3 illustrating display of another voltage signal;

FIG. 4A is a graphical representation of the signal being displayed in FIG. 4;

FIG. 5 is a view similar to FIG. 3 illustrating display of the constant voltage signal;

FIG. 5A is a graphical representation of the signal displayed in FIG. 5;

DESCRIPTION OF THE PREFERRED EMBODIMENT

Figure 2:
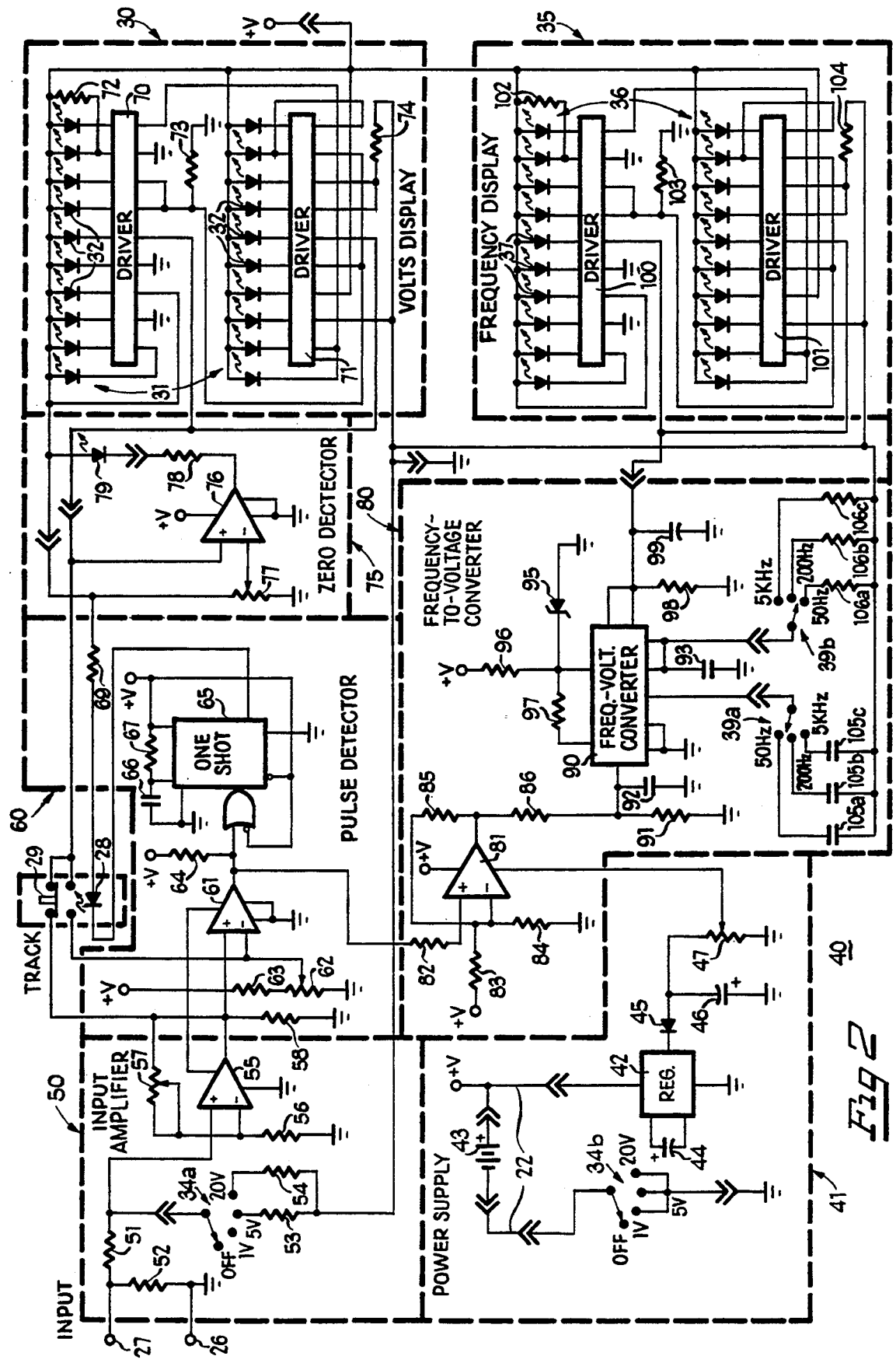
FIG. 2 is a schematic circuit diagram of the circuitry of the meter of FIG. 1.

Referring to FIG. 1, there is illustrated a voltage/frequency meter 20, constructed in accordance with and embodying the features of the present invention. The meter 20 includes a rectangular, box-like housing 21 provided with a pair of battery leads 22 terminating in a connector 23 for connection to an associated battery power source, such as a 9-volt battery. The front of the housing 21 is closed by a front panel 25 from which project negative and positive input terminals 26 and 27, respectively. Mounted in a complementary aperture in the front panel 25 is a light-emitting diode ("LED") 28 and an associated adjustment knob 28a for a use to be explained more fully below. Also projecting from the front panel 25 is a push button switch 29 to permit viewing of the voltage level set by the adjustment knob 28a, as will be explained below.

The front panel 25 also includes a voltage display 30 and a frequency display 35 which are of similar construction. The voltage display 30 includes an array 31 of a plurality of LEDs 32 arranged in a vertical column so as to be visible through a complementary elongated vertical aperture in the front panel 25. Alongside the aperture are three rows of scale indicia 33, with each row including a series of voltage values, the three rows respectively corresponding to 1.0-volt, 5.0-volt and 20-volt scales. Selection among the three scales is effected by a selector switch 34. Similarly, the frequency display 35 includes an array 36 of a plurality of LEDs 37 arranged in a vertical column and provided with associated scale indicia 38, corresponding respectively to 50 Hz., 200 Hz and 5.0 KHz frequency scales, selection among which is effected by a selector switch 39.

Referring now also to FIG. 2, there is illustrated an electrical circuit 40 which is contained within the housing 21. The circuit 40 includes a power supply 41 having an integrated circuit ("IC") regulator 42. Connected across the input terminals of the regulator 42 are the series combination of a battery 43, which may be a 9-volt battery, and a pole 34b of the voltage scale selector switch 34, which is a double-pole, four-position switch, including three positions respectively corresponding to the voltage scales described above, and an OFF position. The positive terminal of the battery 43 provides a +V supply voltage to other parts of the circuit 40, as will be explained more fully below. The regulator 42 has a storage capacitor 44 and it operates to convert the +V supply voltage to a negative voltage which is provided at an output terminal connected to the cathode of a diode 45, the anode of which is connected to ground through a pump capacitor 46 for the regulator 42. The diode 45 provides anti-latch protection for the regulator 42, and its anode is connected to ground through a potentiometer 47.

The input terminals 26 and 27 of the meter 20 are connected to an input amplifier circuit 50, which functions to modify the input voltage to provide a full-scale output of 2.40 volts to the voltage display 30 in any of the three voltage scales. The input voltage first passes through a voltage divider network including resistors 51, 52, 53, and 54. Resistor 52 is connected across the input terminals 26 and 27, while the resistor 51 is connected in series between the input terminal 27 and the movable contact of a pole 34a of the selector switch 34. The resistors 53 and 54 are respectively connected between the 5-volt and 20-volt scale positions of the switch pole 34a and ground. The movable contact of the switch pole 34a is connected to the non-inverting input of an amplifier 55. The 1-volt terminal of the switch pole 34a is unconnected so that when the 1-volt scale is selected, the input voltage passes directly through the resistor 51 to the amplifier 55 at full voltage. In the 5-volt range, the input is reduced by 5 through the voltage divider of resistors 51 and 53, and in the 20-volt range, the input is reduced by 20 through the voltage divider of resistors 51 and 54.

The inverting input terminal of the amplifier 55 is connected to the junction between a resistor 56 and a potentiometer 57, which are connected in series between the output of the amplifier 55 and ground and which function to set the gain of the amplifier 55, which is preferably approximately 2.4. The potentiometer 57 is adjusted to calibrate the voltage display 30.

The output of the amplifier 55 is fed to a pulse detector circuit 60. More specifically, the output of the amplifier 55 is applied to the non-inverting input terminal of an IC comparator 61, which input is also connected through an input balancing resistor 58 to ground. The non-inverting input terminal of the comparator 61 is connected to the wiper of a potentiometer 62, which is connected in series with a resistor 63 between the +V supply and ground to provide a preset voltage level for the comparator 61. The comparator 61 is an open collector type, requiring a pull-up resistor 64 which is connected between its output and the +V supply. The comparator output is also connected to the input of an IC one-shot 65 which produces a pulse output, the width of which is determined by an external capacitor 66 and resistor 67. The output of the one-shot 65 is connected to the cathode of the LED 28, the anode of which is connected through a current-limiting resistor 69 to the +V supply.

In operation, the pulse detector circuit 60 provides a square wave pulse output, which occurs whenever the input voltage rises above the user-determined preset level. The square wave is used to drive the LED 28, which flashes each time the input voltage passes above the preset level. The resistor 63 serves to limit the adjustment range to within usable boundaries. The one-shot 65 serves to ensure that the LED 28 will be visible in the event of very narrow input pulses. More specifically, the one-shot 65 produces an output pulse of about 40 ms. duration at each low to high transition at the output of the comparator 61.

The LED 28 is preferably packaged with the push button switch 29, which is a single-pole, two-position switch, by means of which the user can selectively view the preset voltage level. In its normal position, illustrated in FIG. 2, switch 29 connects the output of the amplifier 55 to the display meter drivers 70 and 71 of the voltage display 30. Each of these drivers 70 and 71 drives one-half of the LEDs 32 of the array 31, these LEDs being connected in parallel between the +V supply and the associated one of the drivers 70 or 71, which are linked by a resistor 72. A resistor 73 determines the full-scale meter voltage and a resistor 74 determines the brightness of the display LEDs 32. As can be seen in FIG. 1, the LEDs 32 provide a visual bar graph representation of the input voltage, as will be explained in greater detail below. When the switch 29 is depressed to its second position, it connects the set point level input of the comparator 61 to the voltage display 30, so that the user can read that voltage level.

Because the display drivers 70 and 71 do not provide outputs for "zero" a zero detector circuit 75 is provided. More specifically, an IC comparator 76 has its non-inverting input connected to the switch 29 and has its inverting input connected to the wiper of a potentiometer 77, which is connected between the +V supply and ground. The reference level determined by the potentiometer 77 is set so that the comparator 76 will provide a low output when the input voltage is less than about 2½% of the full-scale voltage. This low output sinks current for an LED 79, which is connected in series with a current resistor 78 between the +V supply and the output of the comparator 76. As can be seen in FIG. 1, the LED 79 is positioned at the bottom of the array 31.

The output of the comparator 61 of the pulse detector 60 also provides an input to a frequency-to-voltage converter circuit 80, which serves to generate an analog voltage which is representative of the input signal frequency and which is used to drive the frequency display 35. More specifically, the output of the comparator 61 is fed to the non-inverting input terminal of a comparator 81 through an impedance matching resistor 82. The inverting input terminal of the comparator 81 is connected to the junction between resistors 83 and 84 of a voltage divider, which is connected between the +V supply and ground and which determines the crossover point of the comparator 81. A resistor 85 is connected between the output and the inverting input terminals of the comparator 81 to add hysteresis to stabilize the circuit. The comparator 81 is provided with a +V supply voltage that is also provided with a negative supply potential of approximately −4 volts from the wiper of the potentiometer 47 of the power supply 41. Because of this bipolar supply, the low side of the square wave output of the comparator 81 is below circuit ground potential.

The output of the comparator 81 is applied through a current-limiting resistor 86 to the input of an IC frequency-to-voltage converter 90. A resistor 91 and a capacitor 92 are connected in parallel between this input and ground to provide low-pass filtering. A capacitor 93 is connected between the converter 90 and ground to reduce ripple at the output. A Zener diode 95 is connected to regulate the output voltage of the converter 90 against changes in battery voltage. Current limiting for the Zener diode 95 is provided by a resistor 96, which is connected between the Zener cathode and the +V supply. A resistor 97 provides current limiting for a Zener diode internal to the converter 90. A resistor 98 and a capacitor 99 are connected in parallel between the output of the converter 90 and ground to provide filtering of the output signal.

The output of the converter 90 is applied to display drivers 100 and 101 of the frequency display 35, which may be identical to the drivers 70 and 71, described above, and may be configured with the associated LEDs 37 of the array 36 in the same manner as was described above in connection with the voltage display 30. A resistor 102 links the drivers 100 and 101, while a resistor 103 determines the full-scale meter voltage and a resistor 104 determines the brightness of the LEDs 37.

Frequency scaling is accomplished by means of the scale selector switch 39, which is a double-pole, three-position switch including poles 39a and 39b. The pole 39a has a movable contact which is connected to the converter 90 and three fixed contacts which are respectively connected through capacitors 105a, 105b and 105c to ground and respectively correspond to the 50 Hz, 200 Hz and 5 KHz scales. Similarly, the pole 39b has a movable contact connected to the converter 90 and three fixed contacts, respectively connected through resistors 106a, 106b and 106c to ground and respectively correspond to the 50 Hz, 200 Hz and 5KHz scales.

Referring now also to FIGS. 3–10A, the operation of the meter 20 will be described in greater detail in connection with a number of different types of input signals. The user will first connect the input voltage source to the input terminals 26 and 27 and then will turn on the meter 20 by moving the voltage scale selector switch 34 and the frequency scale selector switch 39 to the desired voltage and frequency range scales for the input signal (in this case the 1-volt and 50-Hz scales). The movement of the voltage scale selector switch 34 from its OFF position will serve to power the circuit 40. In FIG. 3A, there is illustrated an input signal 110 which is substantially zero volts, i.e., less than 2½% of the full scale input voltage.. As can be seen in FIG. 3, this will cause illumination of the zero LED 79. Since the selector switch 34 is set to the 1-volt scale, this means that the input signal 110 has a voltage less than 0.025 volts.

In FIG. 4, the meter selector switch 34 is set to the 5-volt scale. If input signal 111, illustrated in FIG. 4A, is applied to the meter 20, only the top LED 32 of the voltage display 30 is illuminated, indicating a 5-volt input signal. In fact, the voltage of the input signal 11 exceeds 5 volts, producing an over-range condition. Thus, whenever the top LED is lit, the user knows that the input signal is either equal to the full-scale reading or is higher than the full-scale reading. By moving the selector switch 34 to the next highest voltage scale, if one is available, the user will obtain a more accurate idea of the range of the input voltage.

In FIG. 5A there is illustrated an input signal 112 which is a DC signal of 3.5 volts. As can be seen in FIG. 5, this causes illumination of only the LED 32 opposite the 3.5-volt range indicium on the voltage display 30.

It will be appreciated that, since none of the input signals 110, 111, 112 is alternating, there will be no frequency display, i.e., none of the LEDs 37 in the frequency display 35 will be illuminated in FIGS. 3, 4 or 5.

Each of the voltage display 30 and the frequency display 35 operates such that each of the LEDs thereof corresponds to a range of voltages or frequencies. Thus, for example, the LED 32 opposite the 3.5 volt indicium corresponds to a range of voltages between 3.5 volts and 4.0 volts, when the meter is set to the 5 volt scale. This LED 32 will be illuminated as long as the input signal is 3.5 volts or greater but less than 4.0 volts. Thus, for a DC input signal, only one LED will be illuminated.

Figure 6:
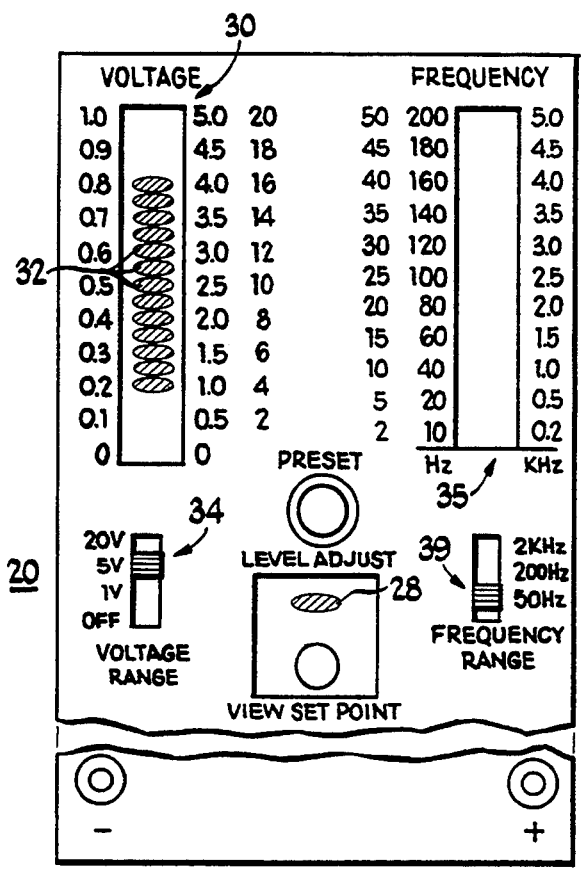
FIG. 6 is a view similar to FIG. 3 illustrating display of an alternating voltage signal.
Figure 6A:
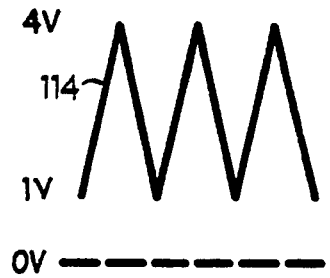
FIG. 6A is a graphical representation of the voltage signal displayed in FIG. 6.

However, when the voltage of the input signal is varying the situation is different. In FIG. 6A, there is illustrated a sawtooth waveform 114 which varies between 1 and 4 volts. Since the voltage of the input waveform 114 is continually changing it causes all of the LEDs 32 between the 1.0 and 4.0-volt indicia to be illuminated. Each will be illuminated only as long as the voltage is in its range. Since the input signal 114 passes through each of these ranges twice each cycle of the waveform, the LEDs will appear to the naked eye to be substantially continuously lit, unless the frequency of the input signal 114 is very low, e.g., less than 10 Hz. Since the leading and trailing flanks of the sawtooth waveform have substantially the same magnitude slope, each illuminated LED 32 will appear to be illuminated at the same brightness, this brightness being a function of the percentage of a reference time interval (such as one cycle of the input signal) during which the LED is illuminated.

It is a another significant aspect of the invention that the set point comparator 61 is used to control the frequency display 35, i.e., the frequency indicated on the frequency display 35 is determined by the rate at which the input signal crosses the set point value. Thus, whether or not there is a frequency indication on the frequency display 35 will be determined not only by whether or not the input signal is an AC signal, but also by the value of the set point voltage level. For example, referring to FIGS. 6 and 6A, if the preset voltage level is set at a voltage outside the range of the input signal, i.e., less than 1.0 volts or greater than 4.0 volts, the input signal 114 will never cross that preset voltage level. Thus, there will be no input to the frequency-to-voltage converter circuit 80 and to the frequency display 35, as can be seen in FIG. 6. Thus, the frequency display 35 will be blank, even though the input signal 114 is an AC signal.

Figure 7A:
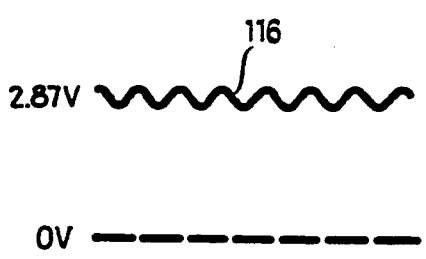
FIG. 7A is a graphical representation of the voltage signal displayed in FIG. 7.
Figure 7:
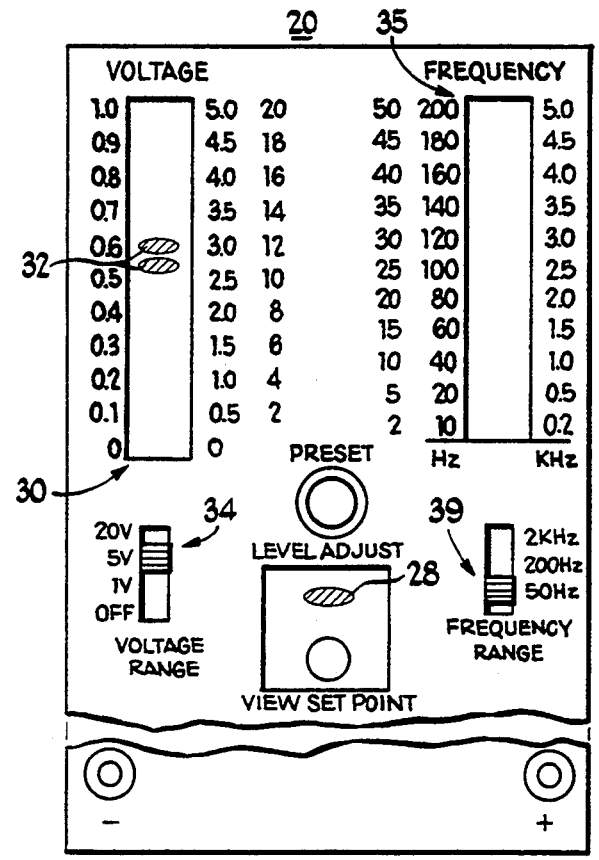
FIG. 7 is a view similar to FIG. 2 illustrating display of another varying voltage signal.

Referring to FIG. 7A, there is illustrated an input signal 116 which is a noisy DC signal of about 2.87 volts. Since the noise in the signal will cause it to periodically reach the 3.0 level, both the 2.5-volt and 3.0-volt LEDs 32 will be illuminated in the voltage display 30, as is illustrated in FIG. 7. If the brightness of the two LEDs is equal, the voltage is midway therebetween, i.e., 2.75 volts. In this case, the voltage is 2.87 volts, so the 3.0 volt LED will be slightly brighter than the 2.5 volt LED.

Figure 8:
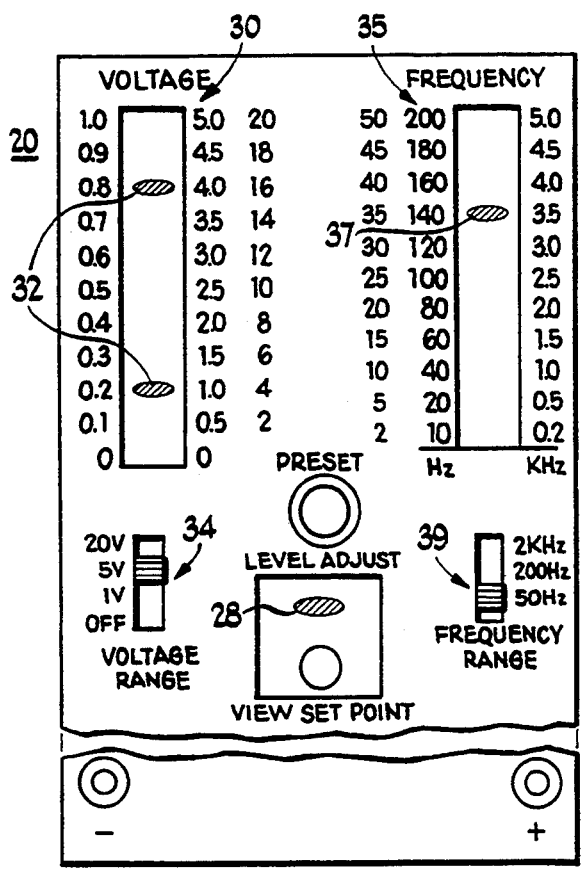
FIG. 8 is a view similar to FIG. 3 illustrating display of the voltage and frequency of another varying input signal.
Figure 8A:
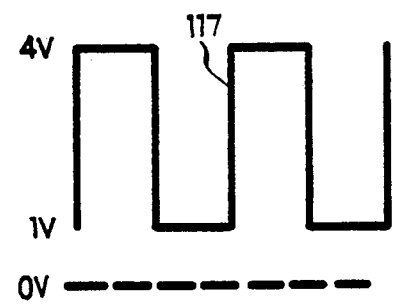
FIG. 8A is a graphical representation of the voltage signal displayed in FIG. 8.

Referring to FIG. 8A, there is illustrated a square wave input signal 117 varying between 1 and 4 volts. Since the voltage jumps instantaneously between the 1 and 4-volt levels, only the LEDs at the 1.0 and 4.0-volt indicia will be illuminated. This is characteristic of a square wave signal. If the set point level is between 1 and 4 volts, the frequency of the input signal 117 will be displayed. In this case, the 50 Hz scale is selected and the frequency display 35 shows that the frequency of the input signal is between 35 and 40 Hz.

It will be appreciated that the output of the pulse detector comparator 61 will also cause the LED 28 to be illuminated. Technically, the LED 28 is triggered once each cycle of the input signal 117. But, because of the operation of the one-shot 65, which causes the LED 28 to be illuminated for about 40 ms for each crossing of the set point level, the LED will be continuously illuminated by a 35 Hz signal.

Figure 9A:
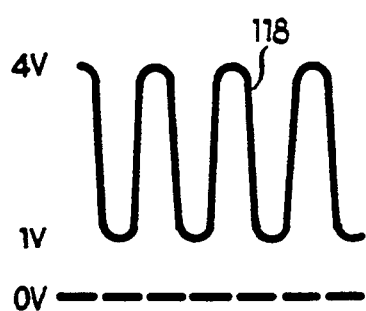
FIG. 9A is a graphical representation of the signal displayed in FIG. 9.
Figure 9:
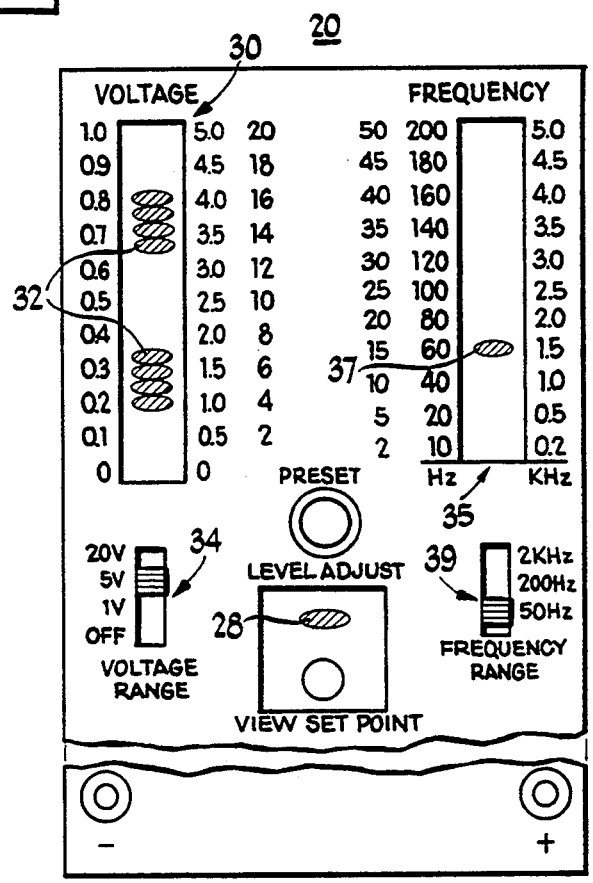
FIG. 9 is a view similar to FIG. 3 illustrating display of the voltage and frequency of another alternating input signal.

In FIG. 9A there is illustrated a sine wave input signal 118 having peaks at 1 volt and 4 volts. The voltage display produced by this input signal is illustrated in FIG. 9. As in the case of FIG. 8, the LEDs for 1 volt and 4 volts are illuminated but, in this case, since the change between these voltage levels is not instantaneous, intermediate LEDs 32 are also illuminated with varying degrees of brightness. This indicates an input signal with a varying rate of voltage change, signifying a sinusoidal signal. If the preset voltage level is set between 1 and 4 volts, the frequency display 35 will also be activated. In this case, it indicates a frequency of between 15 and 20 Hz. The LED 28 will also be illuminated at the frequency of the signal 118, as was explained above which, to the naked eye, will appear to be substantially continuous illumination. Thus, it can be seen that the meter 20 indicates not only the voltage and frequency, but also the nature of the input signal.

Figure 10:
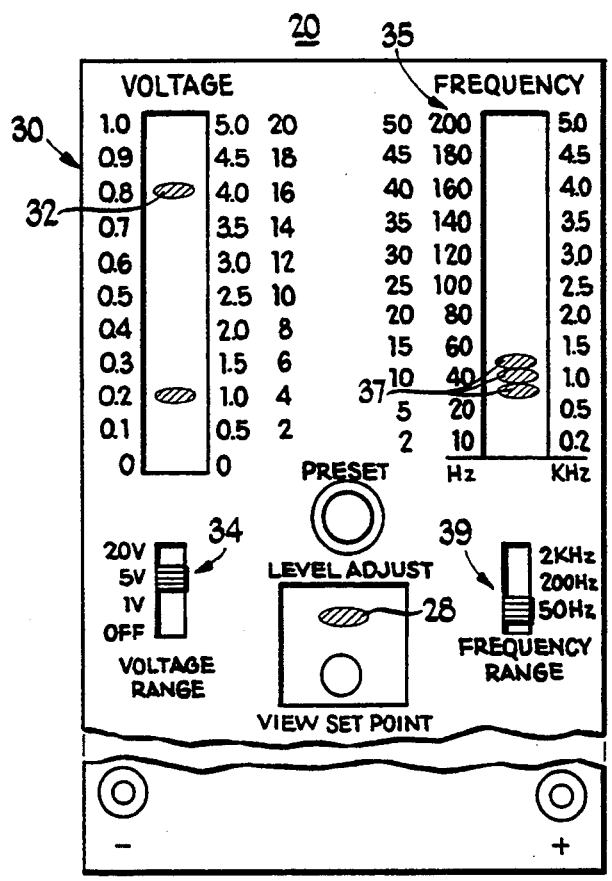
FIG. 10 is a view similar to FIG. 3 illustrating display of the voltage and frequency of another input signal.
Figure 10A:
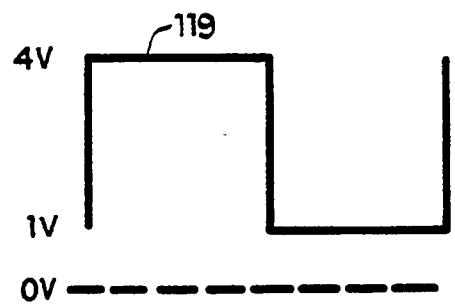
FIG. 10A is a graphical representation of the signal displayed in FIG. 10.

Referring to FIG. 10A, there is illustrated a square wave input signal 119 varying between 1 volt and 4 volts, which is similar to the square wave of FIG. 8A, except that it is at a much lower frequency. As was the case with the square wave of FIG. 8A, the voltage display 30 will have the LEDs 32 at the 1 and 4-volt levels illuminated and, if the set point voltage level is between 1 and 4 volts, the frequency display 35 will also be activated. In this case, a small cluster of LEDs 37 at the bottom of the frequency display 35 are lit. This occurs due to the low frequency characteristics of the frequency-to-voltage converter circuit 80. In order to select the most nearly correct frequency, the operator reads the LED nearest the center of the illuminated cluster, in this case, the one corresponding to 10 Hz.

As was indicated above, whenever the operator wishes to view the preset voltage level which has been selected by means of the adjustment knob 28a, he simply depresses the push button switch 29. As can be seen in FIG. 2, this connects the preset level input of the comparator 61 directly to the voltage display 30, so that the preset voltage level will be displayed on the voltage display 30. As soon as the switch 29 is released, it returns to its normal position illustrated in FIG. 2 for displaying the input signal.

It is a significant aspect of the invention that even a single, instantaneous or momentary crossing of the preset level by the input signal can be detected by the user. For example, in the situation illustrated in FIGS. 6 and 6A, if the preset level were between 0 and 1 volt, in the case of a malfunction in the device under test, or for other reasons, the voltage level may momentarily drop below 1 volt, for example to 0, and this may not be detectable by the operator on the voltage display 30. However, this crossing of the preset level will cause the LED 28 to be illuminated and, by reason of the one-shot 65, this illumination will last for 40 ms, a more than adequate time for the event to be seen by the operator. Similarly, the meter 20 can be used to detect signals which surpass a desired upper limit. This could occur when measuring the voltage at a solenoid or other inductive component which is being energized and de-energized. Such devices often have protective circuitry which suppresses the high voltage spike generated by a collapsing magnetic field around the inductor, which spikes could damage other circuitry in the system. In measuring a solenoid operating from a square wave alternating, e.g., between a peak of 12 volts and a value of 0 volts, the preset level could be set to 14 volts. If the suppression circuitry is operating properly, the LED 28 would not be illuminated. However, if the suppression circuitry fails, high voltage spikes will be present and the LED 28 will indicate their existence.

In a constructional model of the invention, the amplifier 55 and the comparator 81 may each be a TLC 271 and the comparators 61 and 76 may each be an LM 311. The one-shot 65 is a CD 4538, the regulator 42 is an ICL 7660, each of the display drivers 70, 71, 100 and 101 is an LM 3914 and the converter 90 is an LM 2917. While the meter 20 has been described as providing certain predetermined voltage and frequency scales, it will be appreciated that other scale ranges could be provided.

From the foregoing, it can be seen that there has been provided an improved voltage/frequency meter which is capable of providing, simultaneously, bar-graph displays of both the instantaneous voltage and the frequency of an input signal, which affords an indication of the nature of the input signal, and which indicates even momentary passage of the input signal beyond a preset limit, all with the use of simple and inexpensive LED display elements.

We claim:

1. An apparatus for providing a visual display of an instantaneous level of a variable electric analog signal comprising: first display means including a series of display elements respectively corresponding to different predetermined signal level ranges, display drive means coupled to said first display means and responsive to the analog signal for activating a display element for only as long as the instantaneous level of the analog signal lies in the range corresponding to the display element, limit selection means for selecting a predetermined limit, comparison means for comparing the analog signal to the predetermined limit and generating a limit signal when the instantaneous level of the analog signal crosses beyond the predetermined limit, and second display means coupled to said comparison means and responsive to said limit signal for producing a visual indication.

2. The apparatus of claim 1, wherein each of said display elements is a light emitting diode.

3. The apparatus of claim 1, wherein said second display means includes a light emitting diode.

4. The apparatus of claim 3, wherein said second display means includes means for maintaining said light emitting diode energized for a predetermined time period in response to said limit signal.

5. The apparatus of claim 1, wherein said comparison means includes means for generating said limit signal when the instantaneous level of the analog signal crosses above the predetermined limit.

6. The apparatus of claim 1, and further comprising means coupling said limit selection means to said first display means for displaying the predetermined limit.

7. The apparatus of claim 1, wherein said display drive means includes means responsive to the voltage of the analog signal for activating a display element for as long as the instantaneous voltage of the analog signal lies in a voltage range corresponding to the display element.

8. The apparatus of claim 1, wherein said display drive means cooperates with said first display means for causing each display element to produce a visible light the intensity of which is directly proportional to the time duration that the instantaneous level of the analog signal lies in the range corresponding to the display element.

9. Apparatus for providing a visual display of the instantaneous voltage and the frequency of a variable electric analog signal comprising: voltage display means including a series of voltage display elements respectively corresponding to different voltage level ranges, voltage display drive means coupled to said voltage display means and responsive to the analog signal for causing a voltage display element to produce a visual indication for only as long as the instantaneous voltage of the analog signal lies in the voltage level range corresponding to the display element, frequency display means including a series of frequency display elements respectively corresponding to different frequency ranges, means responsive to the analog signal for generating a drive signal having the frequency of the analog signal, and frequency display drive means coupled to the frequency display means and responsive to the drive signal for causing a frequency display element to produce a visual indication when the frequency of the analog signal lies in the frequency range corresponding to the frequency display element.

10. The apparatus of claim 9, wherein said frequency display drive means includes a frequency-to-voltage converter.

11. The apparatus of claim 9, and further comprising means for varying the frequency and voltage ranges which respectively correspond to said voltage display elements and said frequency display elements.

12. The apparatus of claim 9, wherein said means responsive to the analog signal includes comparison means for comparing the analog signal to a predetermined limit and generating a limit signal when the instantaneous level of the analog signal crosses the predetermined limit.

13. The apparatus of claim 12, wherein said means responsive to the analog signal further includes limit selection means for selecting said predetermined limit.

14. The apparatus of claim 12, wherein said frequency display drive means includes means connected to said comparison means for displaying the frequency of said limit signal.

15. Apparatus for providing a visual display of the instantaneous voltage and the frequency of a variable electric analog signal comprising: voltage display means including a series of voltage display elements respectively corresponding to different voltage level ranges, voltage display drive means coupled to said voltage display means and responsive to the analog signal for causing a voltage display element to produce a visual indication for as long as the instantaneous voltage of the analog signal lies in the voltage level range corresponding to the display element, limit selection means for selecting a predetermined voltage limit, comparison means for comparing the analog signal to the predetermined voltage limit and generating a limit signal when the instantaneous voltage of the analog signal passes beyond the predetermined limit, limit display means coupled to said comparison means and responsive to said limit signal for producing a visual indication, frequency display means including a series of frequency display elements respectively corresponding to different frequency ranges, means responsive to the limit signal for generating a drive signal having the frequency of the limit signal, and frequency display drive means coupled to the frequency display means and responsive to the drive signal for causing a frequency display element to produce a visual indication when the frequency of the limit signal lies in the frequency range corresponding to the frequency display element.

16. The apparatus of claim 15, wherein said limit display means includes means for maintaining said visual indication for a predetermined time period in response to said limit signal.

17. The apparatus of claim 15, and further comprising means coupling said limit selection means to said voltage display means for displaying the predetermined limit.

18. The apparatus of claim 15, wherein said voltage display drive means cooperates with said voltage display means for causing each voltage display element to produce a visible light the intensity of which is directly proportional to the time duration that the instantaneous voltage of the analog signal lies in the voltage level range corresponding to the voltage display element.

19. The apparatus of claim 15, and further comprising means for varying the frequency and voltage ranges which respectively correspond to said voltage display elements and said frequency display elements.

* * * * *